US006288579B1

(12) United States Patent
Raghavan et al.

(10) Patent No.: US 6,288,579 B1
(45) Date of Patent: Sep. 11, 2001

(54) METHOD TO INCREASE FREQUENCY OF DIGITAL CIRCUITS

(75) Inventors: Gopal Raghavan; Michael G. Case, both of Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/456,099

(22) Filed: Dec. 7, 1999

(51) Int. Cl.[7] .................................................. H03K 3/00
(52) U.S. Cl. ........................ 327/108; 327/110; 327/111
(58) Field of Search .................................. 327/108–112

(56) References Cited

U.S. PATENT DOCUMENTS

| | | | | |
|---|---|---|---|---|
| 5,039,891 | * | 8/1991 | Wen et al. | 327/113 |
| 5,920,224 | * | 7/1999 | Preslar | 327/110 |
| 6,094,084 | * | 7/2000 | Abou-Allam et al. | 327/356 |
| 6,121,809 | * | 9/2000 | Ma et al. | 327/246 |
| 6,121,940 | * | 9/2000 | Skahill et al. | 343/860 |

OTHER PUBLICATIONS

Jensen, J.F., et al., “39.5 GHz Static Frequency Divider Implemented in A1InAs/GaInAs HBT Technology,” Proceedings of the 1992 GaAs IC Symposium (1992) pp. 101–104.

Wurzer, M., et al., “A 42GHz Static Frequency Divider in a Si/SiGe Bipolar Technology,” Proceedings ISSCC (1997) pp 122–123.

* cited by examiner

*Primary Examiner*—Toan Tran
(74) *Attorney, Agent, or Firm*—Ladas & Parry

(57) ABSTRACT

A method to design and fabricate circuits is disclosed which will permit such circuits to operate at higher frequencies. The method is particularly adapted to integrated digital circuits, and to differential sections of such circuits, but may be applied more broadly. A load on the output of an amplifying section of the circuit is designed employing a section of high impedance inductive transmission line nearest the output node, which is then connected to a section of low impedance capacitive transmission line, and then is terminated into a resistor which provides the 0 Hz load for the circuit. By reducing the effect of the resistor portion of the load, the capacitive transmission line section permits the entire load, as seen at the output of the amplifying section, to appear more ideally inductive than has previously been achieved. Due to this inductive appearance, response times are improved and the circuit is able to operate at significantly higher frequencies.

20 Claims, 3 Drawing Sheets

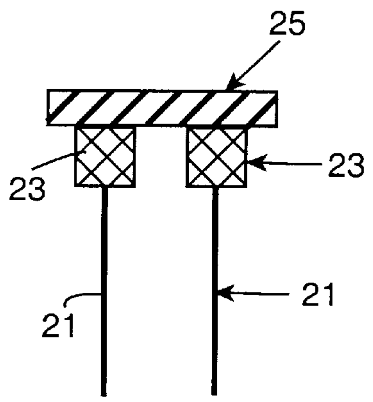
FIG. 2
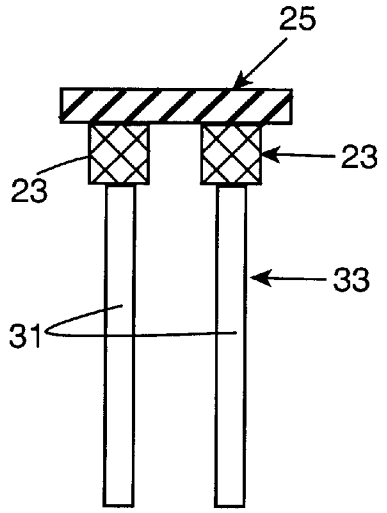
FIG. 3
FIG. 4
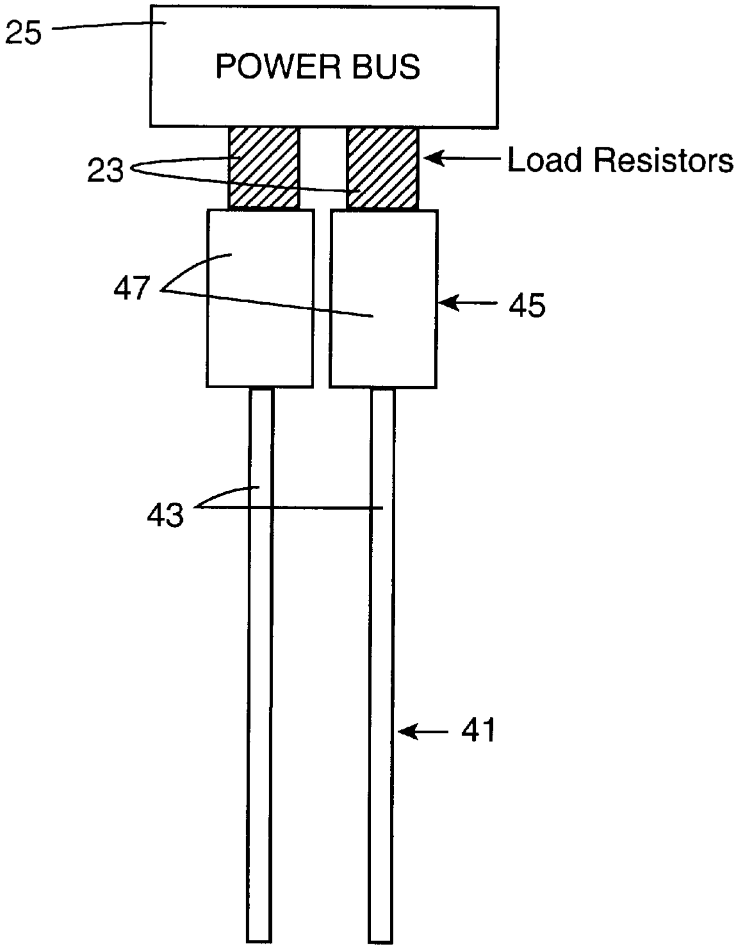

METHOD TO INCREASE FREQUENCY OF DIGITAL CIRCUITS

TECHNICAL FIELD

The present invention relates to shaping load impedance to maximize the operating frequency of electronic circuits, and is particularly applicable to digital circuit design and integrated circuit layout.

BACKGROUND OF THE INVENTION

Many electronic circuits, particularly digital circuits, are required to function over a very broad frequency range from DC to very high frequencies. A load resistor is typically used to convert switching currents to output voltages. In order to extend the operating frequency of such gates, it is well known to place an inductor in series with the load resistor (see, e.g., "Transmission Lines for Digital and Communication Networks," R. E. Matick, IEEE Press, New York, 1995). Such a load inductor raises the impedance for high frequency components of signals, while retaining the resistive load to generate a stable output voltage at low frequencies.

The load inductor can be realized as a lumped element at lower frequencies, but as operating frequencies rise above 10 GHz, the inductor must be treated as a transmission line having distributed inductance and distributed capacitance. These distributed effects are often detrimental, and may limit maximum operating frequencies.

Conventional digital loads are simply connections to load resistors (see, e.g., "39.5 GHz Static Frequency Divider Implemented in AlInAs/GaInAs HBT Technology" by J. F. Jensen et al., Proceedings of the 1992 GaAs IC Symposium, pp. 101–104). An inductive transmission line has been used as a load to enhance the operating frequency of digital circuits, as described by M. Wurzer et al. in "A 42 GHz Static Frequency Divider in a Si/SiGe Bipolar Technology" (Proceedings ISSCC, 1997, pp 122–123). This inductive transmission line approach, however, provides only about 5%–10% improvement in operating frequency over conventional load resistor connection techniques.

Current integrated circuit technology, using devices such as InP heterojunction bipolar transistors (HBTs), have the potential to operate at millimeter-wave frequencies exceeding 100 GHz. However, standard circuit design techniques limit operation to about half of that frequency. Previous efforts to increase operating frequency by modifying circuit loads with inductors or inductive transmission lines have resulted in only slight increases in circuit speeds. Thus, particularly to take advantage of the high frequency capabilities of present semiconductor devices, a need exists to improve circuit design techniques to support higher frequency operation of electronic circuits.

BRIEF DESCRIPTION OF THE INVENTION

The present invention addresses the need for better inductive loads for digital circuits. It can increase operating frequencies of digital differential stages by 20% to 30% without sacrificing low frequency operation.

The basis of the invention is to use the distributed impedance or transmission line characteristics of inductive digital loads to advantage, enhancing rather than hampering the performance of digital circuits. By adding a section of low impedance, or "capacitive," transmission line to a high impedance, or inductive transmission line, the present invention causes the load to become much more inductive at high frequencies. The capacitive section tends to shunt the real load resistance at very high frequencies, such that the remaining impedance is more inductively reactive, and of higher impedance. The resulting load appears mostly resistive at low frequency, and mostly inductive at high frequency. The effect of reducing the real resistance components is to reduce time constants which, otherwise, will limit minimum circuit response times and thus limit maximum operating frequencies.

The preferred embodiment of the present invention modifies the collector loads for a digital switching circuit having a differential output, with each collector load connection forming one side of a transmission line. The differential output voltage is taken from output voltage nodes near each collector of the differential pair of current-controlling transistors. Between these nodes and the supply line (or other circuit common point), an inductive transmission line load is created by forming long, relatively thin connection lines which are well separated from each other. Then, between the inductive transmission line so formed and a resistive load attached to the circuit common, a section of highly capacitive transmission line is established by employing very wide traces which face each other closely. The net effect at very high frequencies is to cause the differential load to appear almost entirely inductive.

BRIEF DESCRIPTION OF THE FIGURES

FIG. 2 shows a layout for a conventional differential load.

FIG. 3 is a layout for a prior art inductive differential load.

FIG. 4 shows a layout for a differential load according to the present invention.

DETAILED DESCRIPTION

Figure 1:
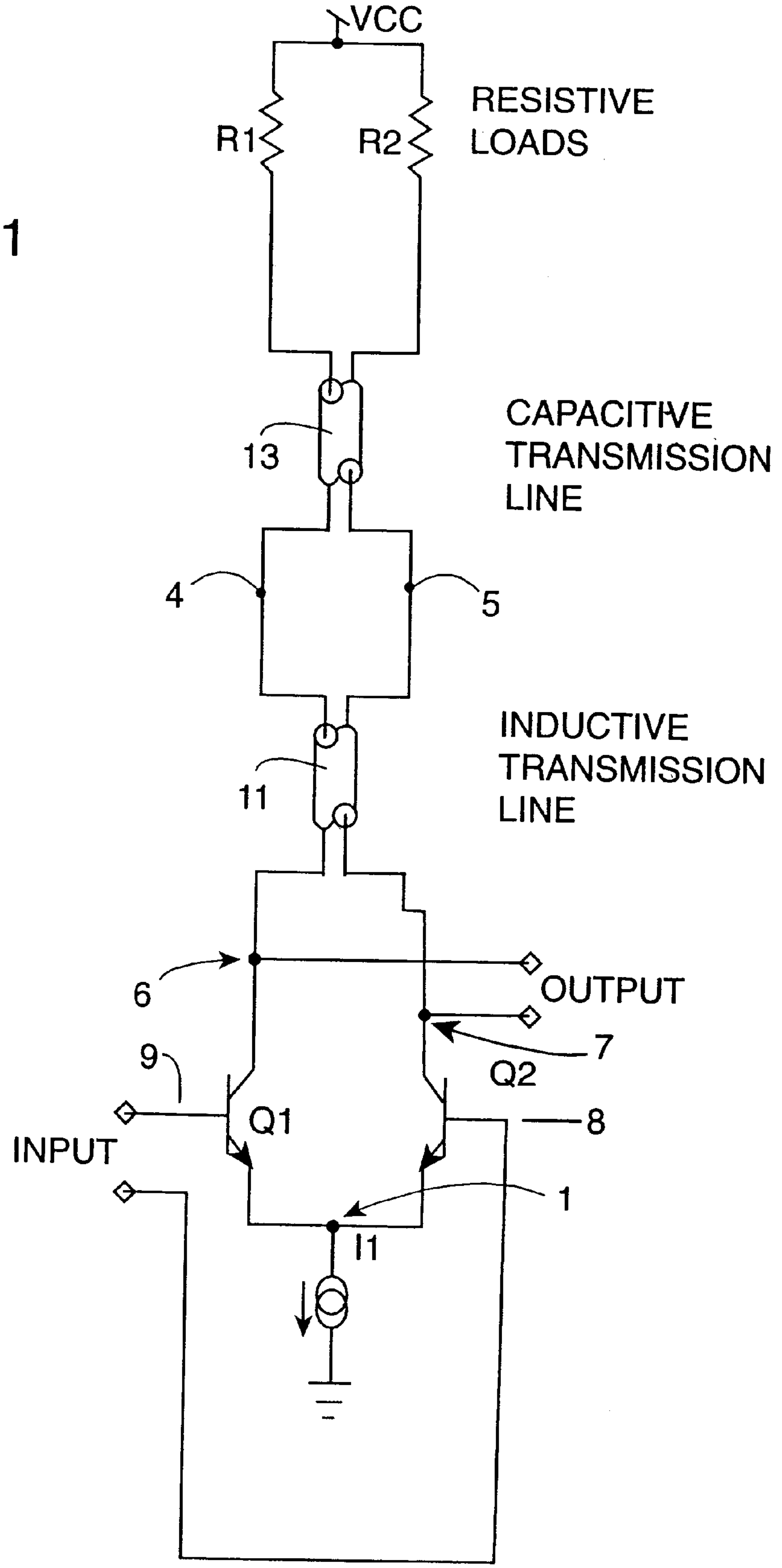
FIG. 1 schematically shows a representative circuit employing the present invention.

FIG. 1 shows an electronic amplifying circuit employing loads according to the present invention. The differential input appears between base 9 of transistor Q1 and base 8 of transistor Q2. The differential output voltage is developed between output voltage node 6 at the collector of Q1 and output voltage node 7 at the collector of Q2. Current source I1 supplies emitter node 1, which is connected to the emitter of both transistor Q1 and transistor Q2. Therefore, since the sum of the current through node 6 plus the current through node 7 is nearly identical to the current provided by current source I1, the load currents from those nodes vary equally and oppositely.

The load current from each of nodes 6 and 7 is converted to a voltage through an impedance. In the DC circuit model, the voltage is developed across resistive loads R1 and R2, respectively, with respect to a circuit common (in this case Vcc). However, in the AC circuit model the output voltage is developed from node 6 with respect to node 7. Since the small signal currents are equal and opposite for this differential circuit, the load impedance may be seen as a single impedance stretched between nodes 6 and 7.

This load impedance, made according to the present invention, first includes a section of inductive transmission line 11 disposed between nodes 6–7 and nodes 4–5. The inductive transmission line, of course, has a fairly high impedance $z_{TL}$, preferably greater than the sum of the resistive loads. Transmission line section 11 preferably terminates directly into capacitive transmission line section 13, which has a fairly low impedance $z_{TC}$. The other end of section 13 preferably terminates directly to the resistive load, $R_{ld}$, which for moderate frequencies appears as R1+R2. For operating frequency enhancement using the present invention, preferably $z_{TC} \leqq R_{ld} \leqq z_{TL}$. R1 and R2, of course, are each connected to Vcc in the preferred embodiment.

In a typical differential circuit section, R1=R2=R, so $R_{ld}$=2*R. Preferably, $40\ \Omega \leqq z_{TC} \leqq (R1+R2) \leqq z_{TL} \leqq 150\ \Omega$. However, this preferred range is determined in part by the present inconvenience of fabricating, on a substrate, an inductive transmission line having an impedance exceeding 150 Ω, or capacitive transmission line having an impedance less than 40 Ω. The present invention may also be favorably used when the inductive impedance is increased, or the capacitive impedance is reduced, beyond the preferred limits. In the preferred embodiment, the impedance of inductive transmission line section 11 is about 140 ohms, the impedance of capacitive transmission line section 13 is about 42 ohms, and the resistance of R=R1=R2=60 ohms. The optimal value of R will depend upon power dissipation considerations, and also upon the relative increase in impedance, due to the available inductive transmission line impedance, which is desired.

FIG. 2 represents schematically a conventional integrated circuit realization of a load for a differential circuit as shown in FIG. 1. Interconnects 21 are simply metallization of unspecified width which conductively couple the transistor collectors to the corresponding resistive loads 23. Resistive loads 23 are shown as approximately one square of resistive material deposited on the circuit. The depiction of resistive loads 23, however, both in FIG. 2 and subsequently, is merely representational. Since numerous ways to implement such a resistance are very well known to those skilled in the art, such methods will not be further discussed here. Resistive loads 23 are connected to power bus 25, which is typically a direct metal connection to Vcc.

FIG. 3 shows a prior art high-speed digital load utilizing inductive transmission line section 33 consisting of traces 31. The spacing of traces 31 is controlled to set the distributed capacitance, and the thickness of traces 31 is also controlled. The inductance per unit length of traces 31, combined with the capacitance per unit length between traces 31, establishes the characteristic impedance of the transmission line, as is well known in the art. Inductive transmission line section 33 connects to resistive loads 23, which in turn connect to power bus 25 as described in regard to FIG. 2.

FIG. 4 represents an integrated circuit layout of a differential circuit load as described in FIGS. 2 and 3, but modified according to the present invention. In the preferred embodiment, inductive transmission line section 41 consists of metallization traces 43 which are typically 2 microns wide and separated by 20 microns, though other arrangements having somewhat different characteristics are appropriate to provide different characteristic impedances. The characteristic impedance of traces 43, at 2 microns wide on 20 microns centers, is approximately 140 ohms. The inductive transmission line is desirably about 400 microns long, and at that length the effective inductance, at moderate frequencies, is about 0.3 nH. The length of inductive transmission line section 41 is of course variable, depending on circuit and layout constraints.

An important distinguishing feature of FIG. 4 compared to the prior art is the section of capacitive transmission line 45, consisting of metallization traces 47 which are preferably 15 microns wide and separated from each other by only 3 microns. 200 microns is a typical length of capacitive transmission line section 45. Capacitive section 45 terminates at resistive loads 23, which terminate at power bus 25; the resistive load and power bus are the same as for FIGS. 2 and 3, and therefore are given the same reference designations.

Figure 5:
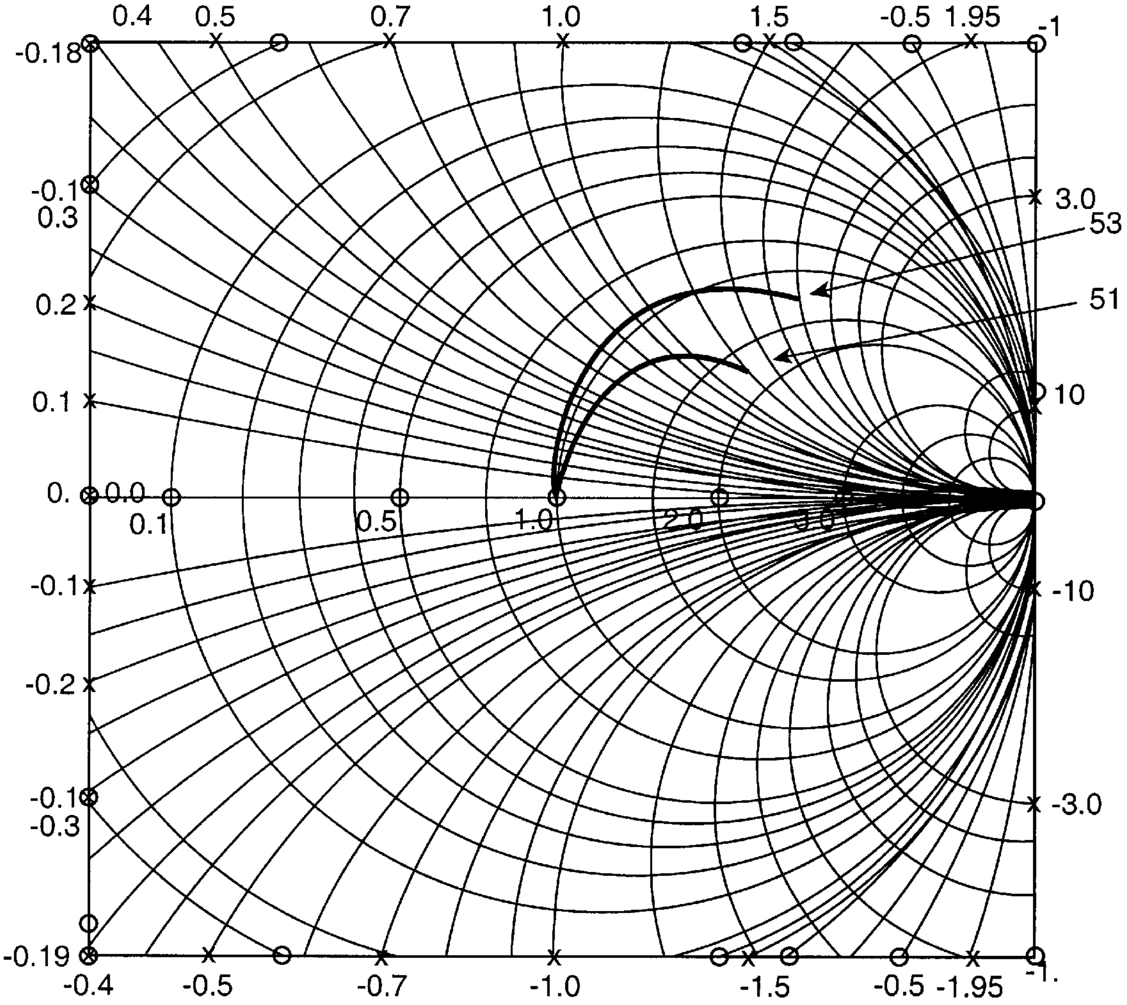
FIG. 5 compares the present invention to the prior art circuit on a Smith chart.

FIG. 5 represents the impedance of a load circuit according to the present invention, compared on a Smith chart to the impedance of the prior art load impedance having only inductive transmission line in series with a resistive load. The prior art impedance is shown by the curve designated 51. This curve is calculated for a 400 micron length of inductive transmission line having an impedance of 140 ohms. The impedance of a load according to the present invention, using the same length of inductive transmission line having the same impedance but adding 200 microns of capacitive transmission line having an impedance of 42 ohms, is shown by curve 53. As frequency rises from low frequencies at which the load impedance is real and normalized to 1, curve 53 shows the real portion of the load impedance decreasing, while the imaginary portion of the load impedance increases. Due to this effect, caused by the capacitive transmission line section, the impedance of a load according to the present invention is substantially more like that of a perfect inductor, overall, than is the impedance of the prior art load. By comparison, curve 51 rolls inward on the Smith chart. Moreover, if the inductive transmission line of the prior art is simply lengthened to 600 microns to match the combined length of the two transmission line sections of the present invention which result in curve 53, Smith chart curve 51 would simply continue to roll in as frequency increases, rotating farther but in the same curve already shown. Curve 51 would not be drawn out toward the outside "perfect inductor" circle of the Smith chart, as occurs with a load according to the present invention.

Alternative Embodiments

The preferred embodiment of this circuit works very effectively on digital differential circuits. However, single-ended circuits can also benefit from this invention. The transmission line, however, would not be connected between the differential outputs, but between the single-ended output and circuit common—typically Vcc. In FIG. 1, a representative single-ended circuit could consist of everything except Q2, R2 and the connection between them. That side of the transmission line, then, would be connected to Vcc. Since it is desirable for the impedance of the inductive transmission line to be very high, in fact Vcc would be as far away as is convenient; and capacitive transmission line section 13 would thus shunt R1. This arrangement works differently from the differential version. One of its advantages is reducing the inductive time constant which the R-L load would have in the absence of capacitive transmission line section 13, which will be beneficial in some instances.

The preferred embodiment of the invention functions very well with resistive loads. However, the invention can also be used when the resistive loads are replaced with load devices which are not primarily resistive in nature, such as semiconductor devices. Thus an alternative embodiment would replace R1 and R2 in FIG. 4 with any element which behaves resistively at the frequency of interest, such as a FET, and another alternative would replace R1 and R2 with a non-linear device such as a bipolar transistor.

Having described the invention in connection with a preferred embodiment and some alternative embodiments thereof, modification will now certainly suggest itself to those skilled in the art. As such, the invention is not to be limited to the disclosed embodiments except as required by the appended claims.

What is claimed is:

1. An integrated circuit comprising:

a first semiconductor current controlling device having a first voltage output node connected through a first load impedance to a circuit common, the first load impedance having elements connected in series including:

a first side of a section of inductive transmission line having distributed inductance and having a net inductive reactance at frequencies above 0 Hz, the first side of the section of inductive transmission line section forming a connection between the first voltage output node and a first transmission line node;

a first side of a section of capacitive transmission line having distributed capacitance and having a net capacitive reactance at frequencies above 0 Hz, the first side of the capacitive transmission line section forming a connection between the first transmission line node and a first resistor node; and a first resistor element which is resistive at 0 Hz connected between the first resistor node and the circuit common.

2. The integrated circuit of claim 1, further comprising a second current controlling device having a second voltage output node, wherein the first and second current controlling devices form a differential pair, and a difference of potential between the first voltage output node and the second voltage output node is a differential circuit output voltage, the integrated circuit including a second load impedance having elements connected in series including:

a second side of the section of inductive transmission line forming a connection between the second voltage output node and a second transmission line node;

a second side of the section of capacitive transmission line forming a connection between the second transmission line node and a second resistor node; and a second resistor element which is resistive at 0 Hz coupled between the second resistor node and the circuit common.

3. The integrated circuit of claim 2 wherein the first voltage output node is connected to the first side of a first end of the inductive transmission line section, and the second voltage output node is connected to the second side of the first end of the inductive transmission line section.

4. The integrated circuit of claim 2 wherein the inductive transmission line section is connected in series with the capacitive transmission line section.

5. The integrated circuit of claim 2 wherein the first side of the capacitive transmission line section is connected at a first end of the capacitive transmission line section to the first resistor element, and the second side of the capacitive transmission line section is connected at the first end of the capacitive transmission line section to the second resistor element.

6. The integrated circuit of claim 2 wherein the first resistor element and the second resistor element are both connected to the circuit common.

7. An electronic circuit comprising:

a current switching device having an voltage output node connected to a load impedance, the load impedance having elements connected in series including a first side of a section of inductive transmission line having a net inductive reactance and being coupled between the output voltage node and a first side of a section of capacitive transmission line;

the section of capacitive transmission line having a net capacitive reactance and the first side of the section of capacitive transmission line being coupled between the first side of the inductive transmission line and a resistive load element; and the resistive element being coupled between the capacitive transmission line and a circuit common;

wherein an output voltage is generated at the output voltage node with respect to the circuit common by current switched through the load impedance by the current switching device.

8. The electronic circuit of claim 7 further comprising a second current switching device having a second voltage output node, wherein the first and second current switching devices form a differential pair, and the difference of potential between the voltage output node and the second voltage output node is a differential circuit output voltage, the integrated circuit including:

a second side of the section of inductive transmission line forming a connection between the second voltage output node and a second side of the capacitive transmission line;

the second side of the section of capacitive transmission line forming a connection between the second side of the section of inductive transmission line and a second resistive load element; and the second resistive element coupled between the second side of the section of capacitive transmission line and the circuit common.

9. The electronic circuit of claim 8 wherein the first voltage output node is connected to the first side of the inductive transmission line section at a first end, and the second voltage output node is connected to the second side of the inductive transmission line section at the first end.

10. The electronic circuit of claim 8 wherein the inductive transmission line section is connected in series to the capacitive transmission line section.

11. The electronic circuit of claim 8 wherein the first side of the capacitive transmission line section is connected at a first end of the capacitive transmission line section to the first resistive element, and the second side of the capacitive transmission line section is connected at the first end of the capacitive transmission line section to the second resistive element.

12. The electronic circuit of claim 8 wherein the first resistive element and the second resistive element are both connected to the circuit common.

13. A method of increasing the operating frequency of an electronic circuit having a first current controlling device and a first output voltage node corresponding to the first current controlling device, a difference between the first output voltage node and a second voltage node being an output voltage, the method comprising the steps of:

disposing an inductive first section of transmission line having first and second conductors and having a net inductive impedance at real frequencies above zero Hz such that the first conductor of the inductive transmission line section is included in a series connection between the first output voltage node and a first intermediate transmission line node and the second conductor of the inductive transmission line section is connected to the second voltage node;

disposing a capacitive second section of transmission line having first and second conductors and having a net capacitive impedance at real frequencies above zero Hz such that the first conductor of the capacitive transmission line section is included in a series connection between the first intermediate transmission line node and a first DC load node and the second conductor of the capacitive transmission line section is connected to the second voltage node; and disposing a first load element between the first DC load node and a circuit common, said first load element being functional to support a voltage between the first DC load node and the circuit common at zero Hz.

14. The method of claim 13 wherein the second voltage node is substantially maintained at the potential of the circuit common.

15. The method of claim 13 wherein the electronic circuit including the inductive transmission line section and the capacitive transmission line section is fabricated as an integrated circuit upon a substrate.

16. The method of claim 14 wherein the electronic circuit is a differential circuit having a second current controlling device having a voltage output at the second voltage node, the method comprising the further steps of:

connecting the second conductor of the inductive transmission line section between the second voltage node and a second intermediate transmission line node;

connecting the second conductor of the capacitive transmission line section between the second intermediate transmission line node and a second DC load node; and connecting a second load element between the second DC load node and the circuit common, said second load element being functional to support a voltage between the second DC load node and the circuit common at zero Hz.

17. The method of claim 16 wherein the first and second load elements are predominantly resistive.

18. The method of claim 17 wherein one end of the first conductor of the capacitive transmission line section is connected directly to the first DC load element and one end of the second conductor of the capacitive transmission line section is connected directly to the second DC load element.

19. The method of claim 18 wherein a second end of the first conductor of the capacitive transmission line section is connected directly to the first conductor of the inductive transmission line section, and a second end of the second conductor of the capacitive transmission line section is connected directly to the second conductor of the inductive transmission line section.

20. The method of claim 18 wherein the current controlling devices each have a primary current path defined between a first terminal and a second terminal, the first terminal being connected to the associated output voltage node, the method including the further step of connecting the second terminal of each current controlling device to a current source.

* * * * *